(12) United States Patent
Ngo (10) Patent No.: US 8,632,365 B2
(45) Date of Patent: Jan. 21, 2014

(54) ELECTRICAL CARD-EDGE CONNECTOR

(75) Inventor: Hung Viet Ngo, Harrisburg, PA (US)

(73) Assignee: FCI Americas Technology LLC, Carson City, NV (US)

(*) Notice: Subject to any disclaimer, the term of this patent is extended or adjusted under 35 U.S.C. 154(b) by 0 days.

(21) Appl. No.: 13/113,847

(22) Filed: May 23, 2011

(65) Prior Publication Data

US 2011/0300760 A1     Dec. 8, 2011

Related U.S. Application Data

(60) Provisional application No. 61/352,245, filed on Jun. 7, 2010.

(51) Int. Cl.
*H01R 24/00* (2011.01)

(52) U.S. Cl.
USPC .......................................................... 439/636

(58) Field of Classification Search
USPC .......... 439/636, 350, 629, 680, 352, 357, 353
See application file for complete search history.

(56) References Cited

U.S. PATENT DOCUMENTS

| | | | |
|---|---|---|---|
| 3,351,894 A | 11/1967 | Kinkaid | |
| 4,695,112 A * | 9/1987 | Maston et al. | ................. 439/350 |
| 4,717,218 A | 1/1988 | Ratcliff | |
| 4,781,612 A | 11/1988 | Thrush | |
| 5,429,525 A * | 7/1995 | McCoy | .......................... 439/352 |
| 5,644,839 A * | 7/1997 | Stone | .............................. 29/842 |
| 5,897,386 A | 4/1999 | Baxter et al. | |
| 5,971,775 A | 10/1999 | Tor et al. | |
| 6,341,988 B1 | 1/2002 | Zhu et al. | |
| 6,733,335 B2 | 5/2004 | Wu | |
| 7,014,475 B1 | 3/2006 | Mongold | |
| D540,264 S | 4/2007 | Zhang | |
| D606,496 S | 12/2009 | Ngo | |
| D606,497 S | 12/2009 | Ngo | |
| D608,293 S | 1/2010 | Ngo | |
| D610,548 S | 2/2010 | Ngo | |
| D621,364 S | 8/2010 | Kasahara | |
| D623,138 S | 9/2010 | Ngo | |
| D639,246 S | 6/2011 | Ngo | |
| D640,201 S | 6/2011 | Ngo | |
| D641,321 S | 7/2011 | Ngo | |
| 8,011,963 B2 | 9/2011 | Atkinson et al. | |
| 8,043,097 B2 | 10/2011 | Ngo et al. | |
| 8,282,402 B2 | 10/2012 | Ngo | |
| 2010/0112834 A1 | 5/2010 | Chen et al. | |
| 2010/0184339 A1 | 7/2010 | Ngo et al. | |

OTHER PUBLICATIONS

U.S. Appl. No. 61/205,276, filed Jan. 16, 2009, Ngo.

* cited by examiner

*Primary Examiner* — Jean F Duverne
(74) *Attorney, Agent, or Firm* — Woodcock Washburn LLP (57) ABSTRACT

A card-edge connector has a housing that includes a housing body, and a plurality of electrical contacts carried by the housing body. The housing is devoid of mounting ears that would extend out from the housing body. Rather, the housing includes opposing mounting guides carried by opposed housing side walls that are configured to receive a complimentary circuit board that the card-edge connector is mounted to.

18 Claims, 11 Drawing Sheets

ELECTRICAL CARD-EDGE CONNECTOR

CROSS-REFERENCE TO RELATED APPLICATIONS

This application claims the benefit of U.S. Provisional Patent Application Ser. No. 61/352,245, filed on Jun. 7, 2010, the disclosure of which is hereby incorporated by reference as if set forth in its entirety herein.

This application is related by subject matter to U.S. Utility patent application Ser. No. 13/113,840 filed May 23, 2011, entitled "Electrical Card-Edge Connector", U.S. Design patent application Ser. No. 29/363,267 filed Jun. 7, 2010, U.S. Design patent application Ser. No. 29/363,269 filed Jun. 7, 2010, and U.S. Design patent application Ser. No. 29/363,270 filed Jun. 7, 2010. The disclosures of all of the above-related patent applications are hereby incorporated by reference as if set forth in their entireties herein.

BACKGROUND

Electrical connector assemblies generally include circuits and components on one or more circuit boards that are connected together by an electrical connector. Examples of electrical components in an electrical connector assembly can include daughter boards, motherboards, backplane boards, midplane boards, or the like. The electrical connector provides an interface between electrical components, and provides electrically conductive paths for electrical communications data signals and/or electrical power.

Figure 1:
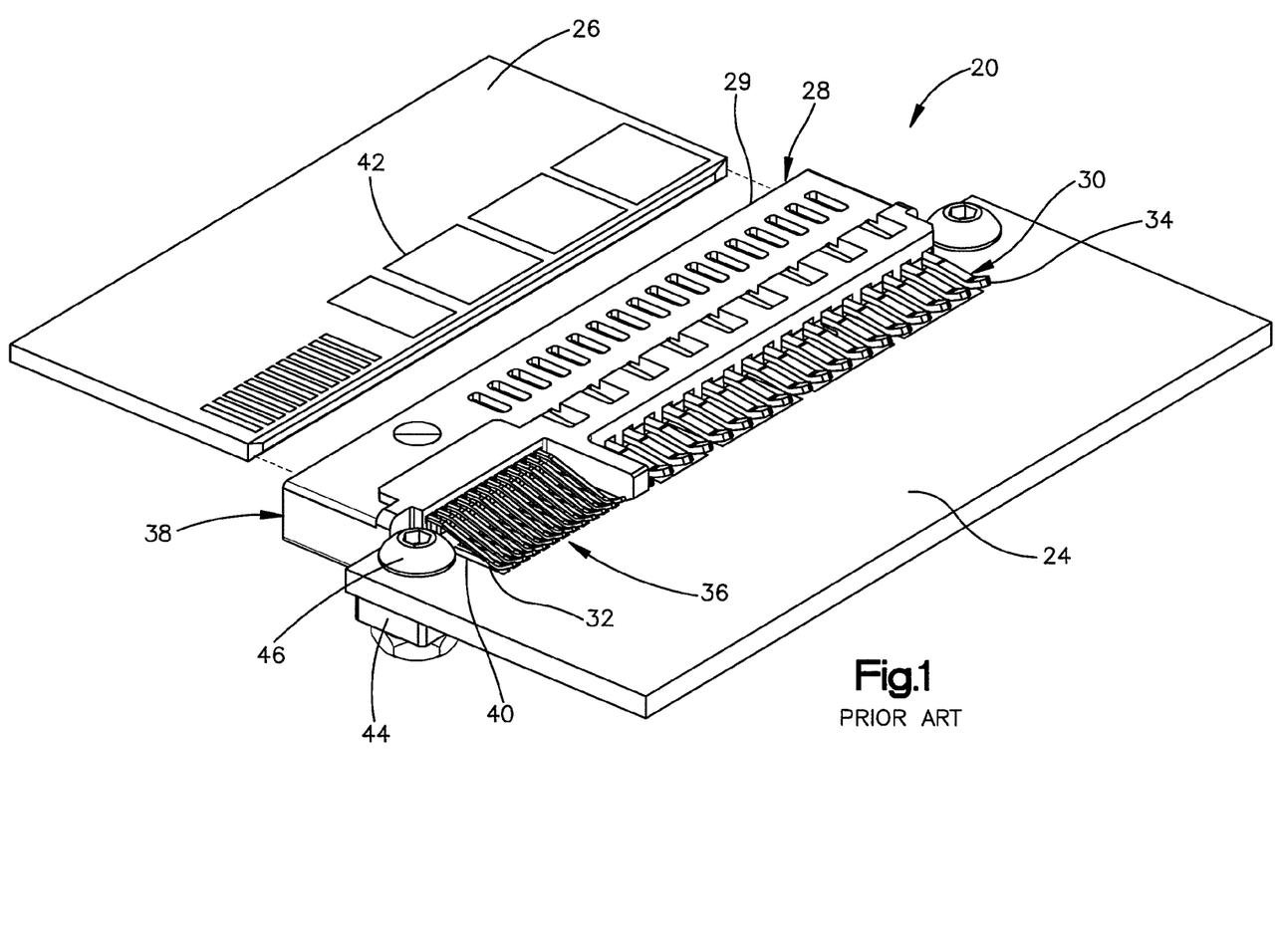
FIG. 1 is a perspective view of an electrical connector assembly including a straddle-mount card-edge connector connected between a pair of circuit boards in accordance with the prior art.

For instance, referring to FIG. 1, one example conventional electrical assembly 20 includes a card-edge connector 22 connected between a first printed circuit board 24 and a second printed circuit board 26. The card-edge connector 22 is illustrated as a straddle-mount style card-edge connector that provides an electrically conductive path between traces at an edge of the first printed circuit board 24 and traces at an edge of the second printed circuit board 26, which is illustrated as being co-planar with the first printed circuit board 24. Such a configuration may be well suited for an electrical assembly in an enclosure, such as a 1U rack-mount server.

The card-edge connector 22 includes a connector housing 28 having a housing body 29 that carries a plurality of electrical contacts 30, which can include electrical signal contacts 32 and electrical power contacts 34. The card-edge connector 22 defines a mounting interface 36 that receives an edge of the first printed circuit board 24, and a mating interface 38 that receives the second printed circuit board 26. The first printed circuit board 24 includes a plurality of electrical contact pads 40 that are connected to the electrical contacts 30 of the card-edge connector 22 when the first printed circuit board 24 is mated to the card-edge connector 22. The electrical contacts 30 and the electrical contact pads 40 are then typically soldered to establish a permanent electrical connection between the electrical contacts 30 of the card-edge connector 22 and the first printed circuit board 24.

The second printed circuit board 26 can be inserted into the mating interface 38 of the edge-card connector 22 so that electrical contact pads 42 of the second printed circuit board 26 are brought into contact with the electrical contacts 30, thereby establishing an electrical connection between the electrical traces of the first printed circuit board 24 and the electrical contacts 30 of the card-edge connector 22. It should thus be appreciated that the card-edge connector 22 can be electrically connected to the first and second printed circuit boards 24 and 26 so as to place the first and second printed circuit boards 26 in electrical communication. The second printed circuit board 26 can be removed from the mating interface 38 of the card-edge connector 22 and re-inserted into the mating interface 38, or another circuit board can be inserted into the mating interface 38 as desired. In this regard, the first printed circuit board 24 can be referred to as a host board, and the second printed circuit board 26 can be referred to as an edge card that can be placed in removable electrical communication with the host board.

The card-edge connector 22 includes a pair of mounting ears 44 that extend out from opposed sides of the housing body 29, and present apertures that are placed in alignment with corresponding apertures on the first printed circuit board 24 when the electrical contacts 30 are placed in contact with the electrical contact pads 40. The aligned apertures are configured to receive hardware 46, such as screws, nuts, and the like, so as to provide a secure physical connection between the card-edge connector 22 and the first printed circuit board 24. Accordingly, when the second printed circuit board 26 is mated to the card-edge connector 22, stresses applied to the card-edge connector 22 from the second printed circuit board 26 that would be absorbed by the connection between the electrical contacts 30 and the electrical contact pads 40 are at least partially absorbed by the secure physical connection between the card-edge connector 22 and the first printed circuit board 24.

Unfortunately, the mounting ears 44 occupy valuable real estate on the first printed circuit board 24.

SUMMARY

In accordance with one embodiment, a card-edge connector is configured to mount to a first printed circuit board along a direction of insertion. The card-edge connector includes a connector housing that has a housing body. The housing body defines first and second side walls. The connector housing carries a plurality of electrical contacts that are arranged between the first and second side walls. The electrical contacts define respective mounting ends configured to be electrically connected to the first printed circuit board at respective connection locations, and opposed respective mating ends configured to be electrically connected to a second printed circuit board when the electrical connector is mated to the second printed circuit board. The card-edge connector further includes at least one at least one mounting guide carried by a respective at least one of the first and second side walls. The at least one mounting guide can be configured to slidably receive a side of the first printed circuit board as the card-edge connector is mounted to the first printed circuit board along the direction of insertion. At least a portion of forces that are generated when the second printed circuit board is misaligned with the electrical connector as the electrical connector is mated with the second printed circuit board is communicated from the connector housing to the received side of the printed circuit board at a location spaced from the connection locations.

BRIEF DESCRIPTION OF THE DRAWINGS

The foregoing summary, as well as the following detailed description of an example embodiment of the application, will be better understood when read in conjunction with the appended drawings. For the purposes of illustrating the flexible anchoring keel and related instruments of the present application, there is shown in the drawings an example embodiment. It should be understood, however, that the application is not limited to the precise arrangements and instrumentalities shown. In the drawings.

DETAILED DESCRIPTION

Figure 2A:
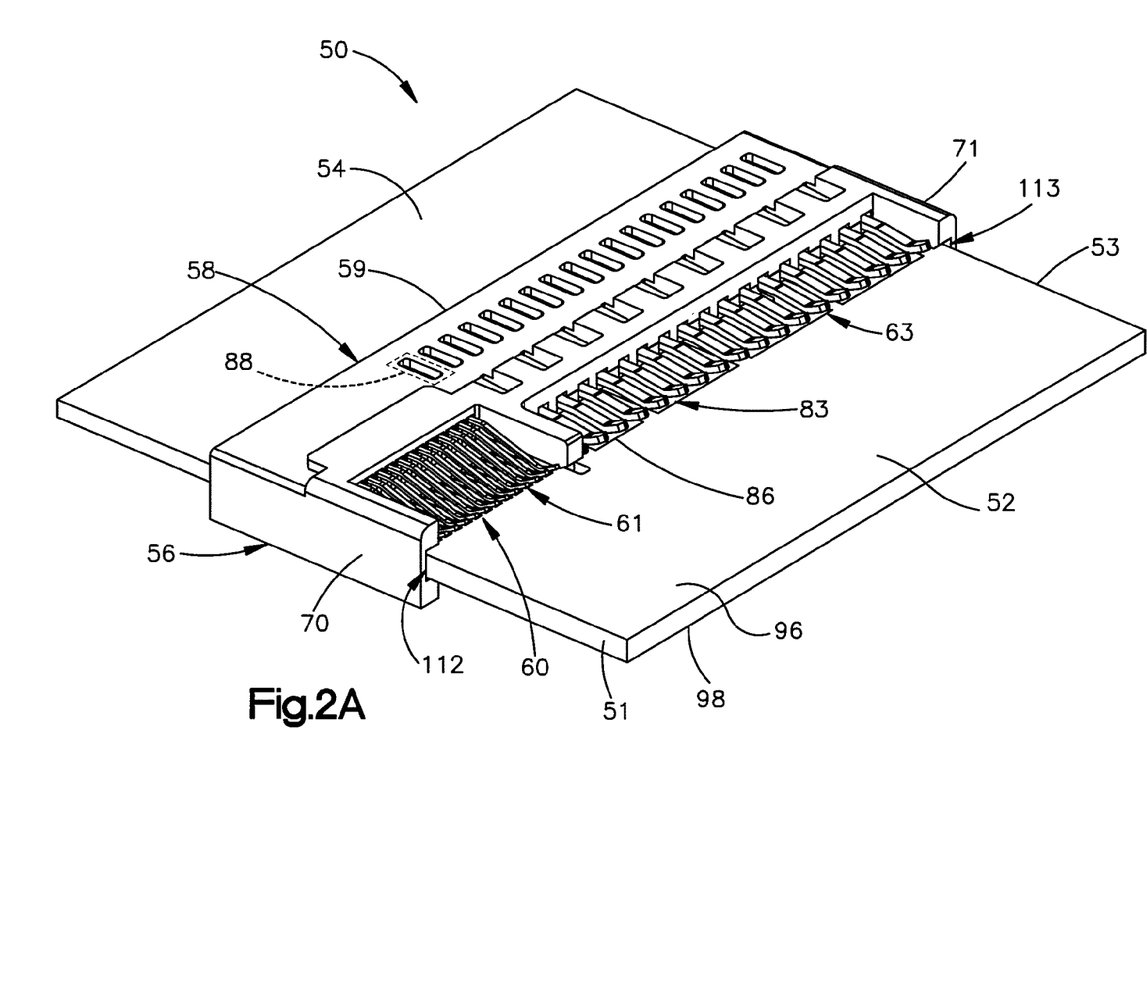
FIG. 2A is a perspective view of an electrical connector assembly constructed in accordance with one embodiment, including a first printed circuit board, a second printed circuit board, and an electrical connector connected between the first and second printed circuit boards.
Figure 2B:
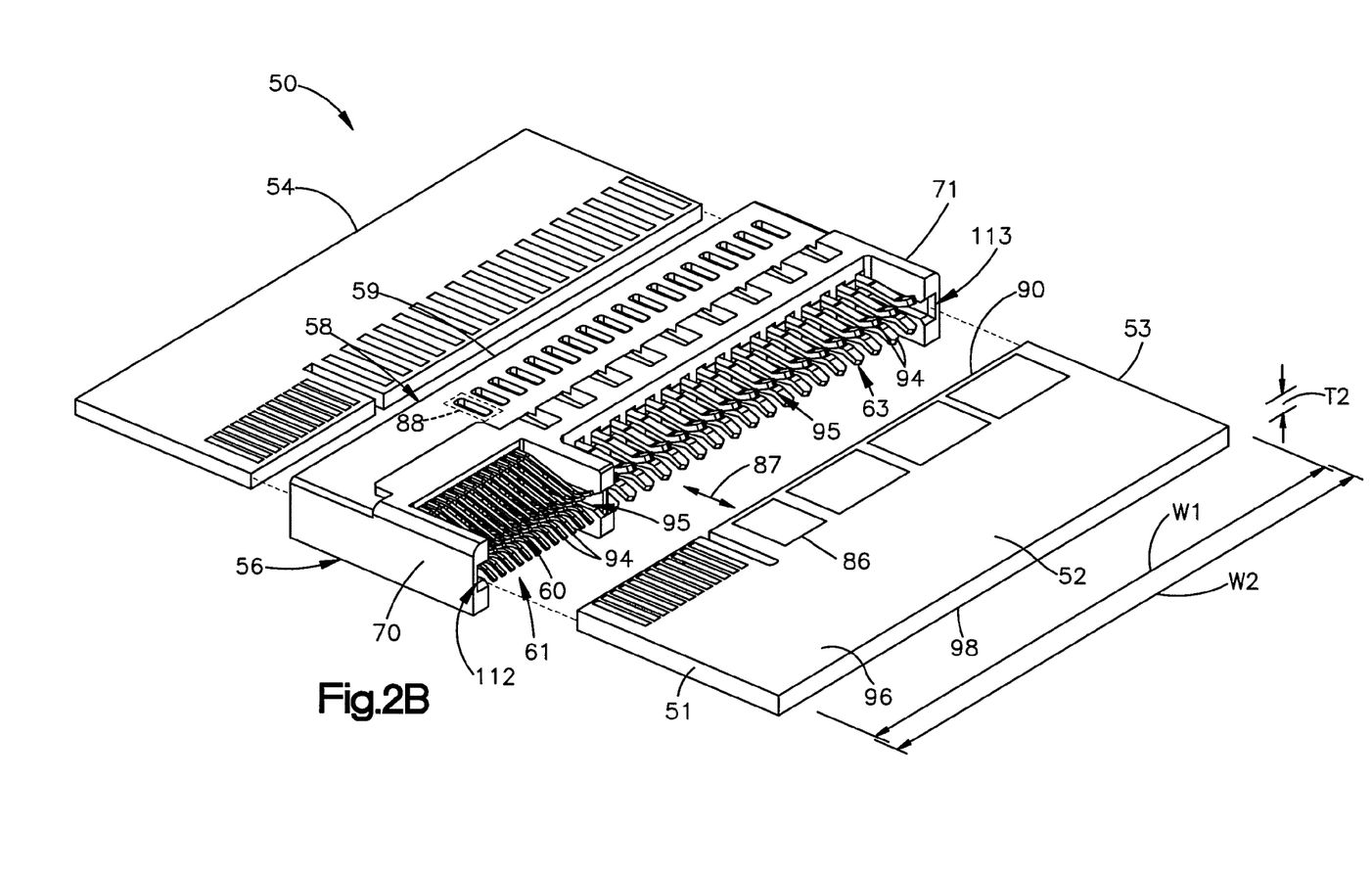
FIG. 2B is an exploded perspective view of the electrical connector assembly as illustrated in FIG. 2A.

Referring to FIGS. 2A-B, an electrical connector assembly 50 includes a first substrate such as a first printed circuit board (PCB) 52, second a substrate such as a second printed circuit board (PCB) 54, and an electrical connector 56 configured to be electrically connected between the first and second printed circuit boards 52 and 54, respectively, so as to place the first printed circuit board 52 in electrical communication with the second printed circuit board 54. The electrical connector 56 is illustrated as a card-edge connector, and can be configured as a straddle-mount connector in accordance with one embodiment, as is described in more detail below.

The electrical connector 56 includes a dielectric or electrically insulative connector housing 58 that can be made of any suitable dielectric material, including a plastic, such as a high temperature thermoplastic. The connector housing 58 includes a housing body 59 that carries one or more electrical contacts 60, arranged in a first or upper row and a second or lower row, configured to engage complementary electrical traces on the first and second printed circuit boards 52 and 54, respectively. In particular, the connector housing 58 defines a mounting interface 62 and a mating interface 64 separated along a longitudinal direction L. The mounting interface 62 is configured to electrically and physically connect to the first printed circuit board 52, and the mating interface 64 is configured to physically and electrically attach to the second printed circuit board 54. The electrical contacts 60 can extend between the mounting interface 62 and the mating interface 64, so as to electrically connect to the first printed circuit board 52 when the electrical connector 56 is mounted to the first printed circuit board 52, and so as to electrically connect to the second printed circuit board 54 when the electrical connector 56 is mated to the second printed circuit board 54. In accordance with one embodiment, the mounting interface 62 can be configured as a straddle-mount interface whereby the electrical contacts 60 straddle the first printed circuit board 52 when the electrical connector 56 is mounted to the first printed circuit board 52. Thus, the connector housing 58 can be referred to as a straddle-mount card-edge housing in accordance with the illustrated embodiment. The electrical connector 56 can be referred to as a card-edge connector, and in particular can be referred to as a straddle-mount connector.

Figure 3:
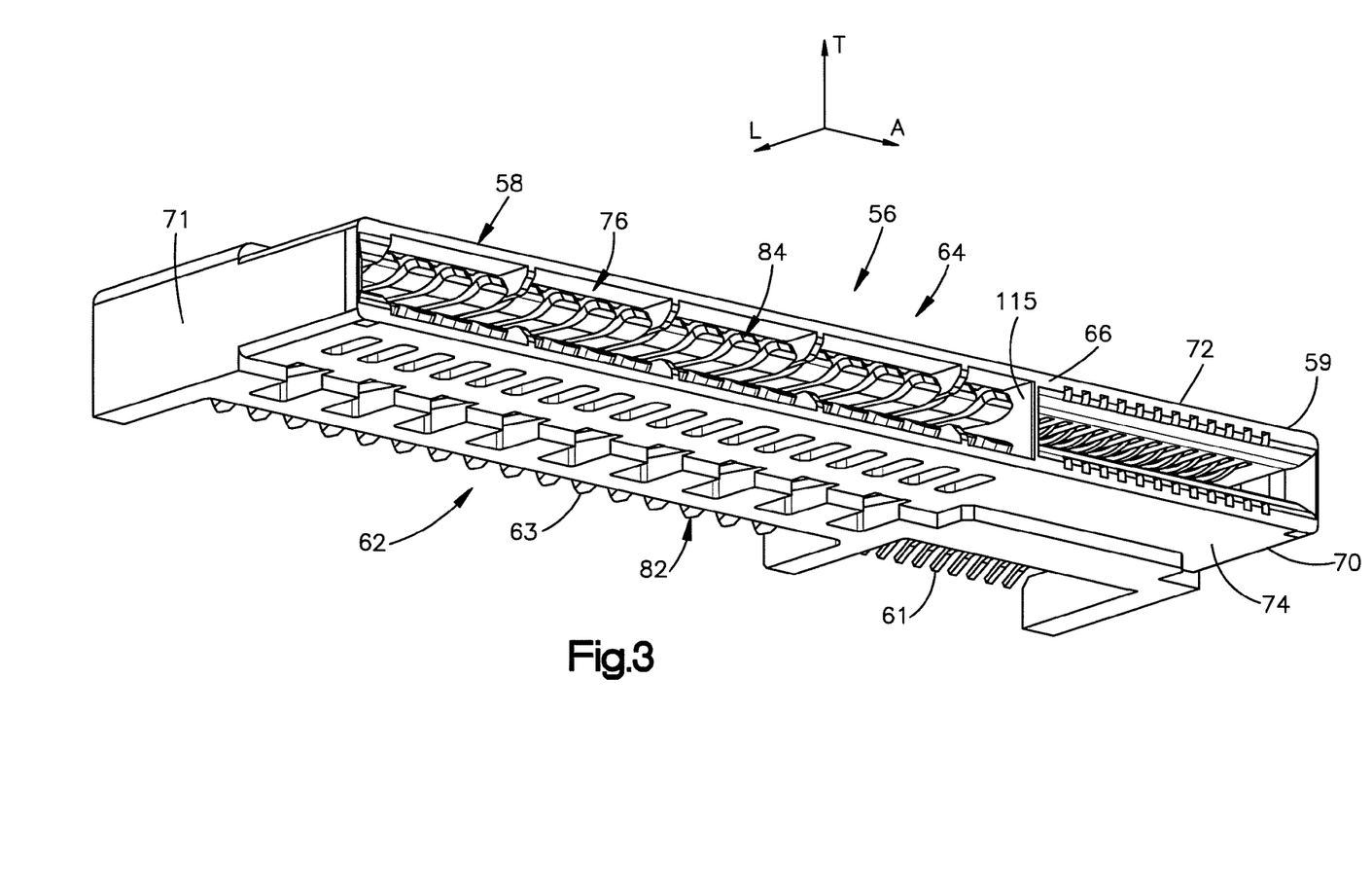
FIG. 3 is a bottom front perspective view of the electrical connector illustrated in FIG. 2.
Figure 4:
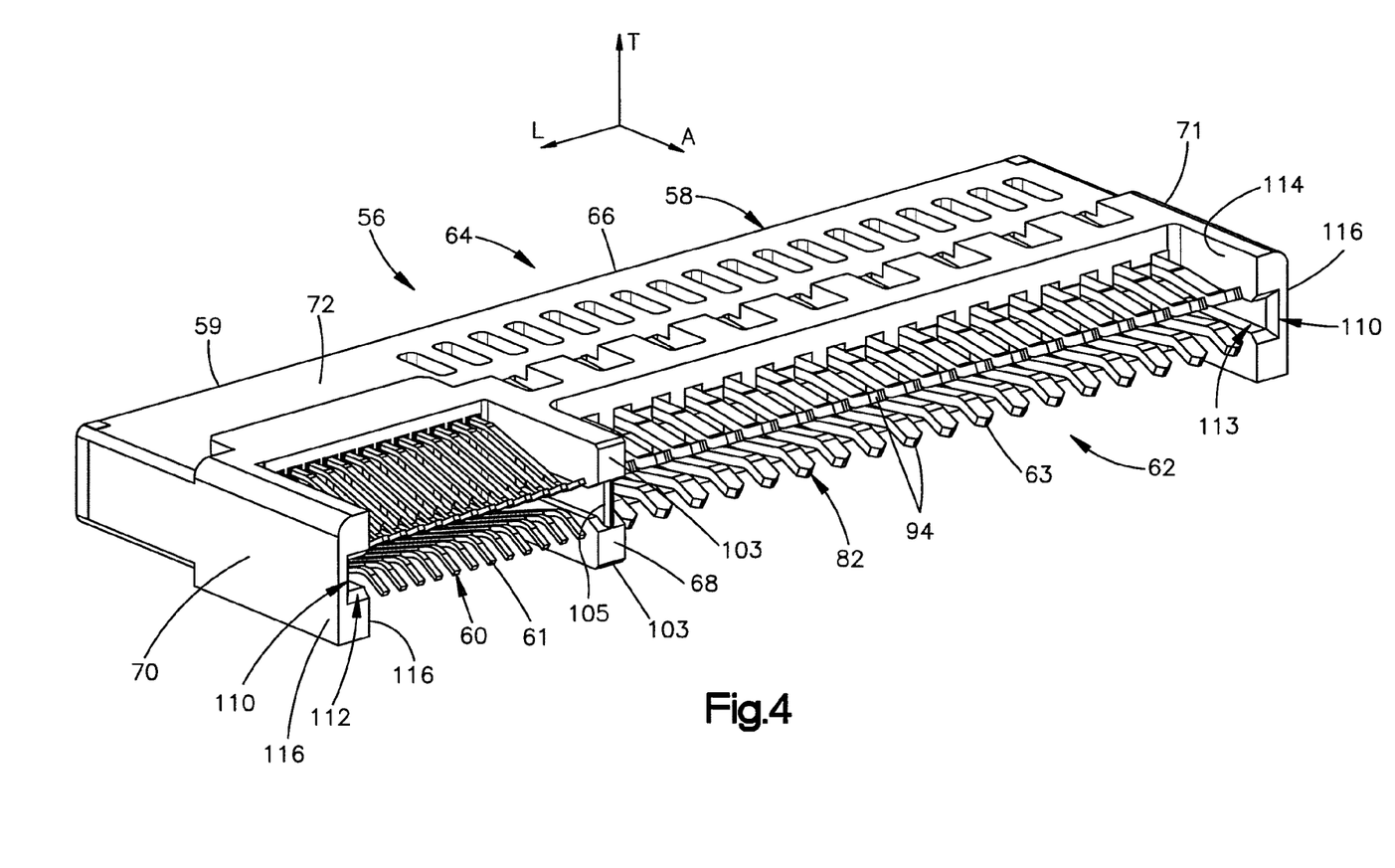
FIG. 4 is a top rear perspective view of the electrical connector illustrated in FIG. 2.

Referring now to FIGS. 3-4, the housing body 59 defines a front end 66 and an opposed rear end 68 that is spaced from the front end 66 along the longitudinal direction L. The front end 66 is disposed proximate to the mating interface 64, and the rear end 68 is disposed proximate to the mounting interface 62. The housing body 59 further defines a first side wall 70 and an opposed second side wall 71 that is spaced from the first side wall along a lateral direction A that is substantially perpendicular to the longitudinal direction L. The first and second side walls 70 and 71 extend between the mating interface 64 and the mounting interface 62. The housing body 59 is elongate along the lateral direction A, and individual ones of the electrical contacts 60 are spaced along the lateral direction A. The housing body 59 further defines an upper end 72 and an opposed lower end 74 that is spaced from the upper end 72 along a transverse direction T that is substantially perpendicular to both the longitudinal direction L and the lateral direction A. The longitudinal and lateral directions L and A, respectively, extend horizontally and the transverse direction T extends vertically as illustrated, though it should be appreciated that the orientation of the electrical connector 56 can vary during operation.

As illustrated in FIGS. 2A-B, the first printed circuit board 52 defines a leading edge 90 with respect to a direction of insertion 87 when mounting the electrical connector 55 to the first printed circuit board 52, a pair of opposed sides 51 and 53, a top surface 96, and an opposed bottom surface 98. When the electrical connector 56 is mounted to the first printed circuit board 52, the top surface 96 is spaced from the bottom top surface 98 along the transverse direction T, and the sides 51 and 53 are spaced along the lateral direction A. The top and bottom surfaces 96 and 98 can be substantially planar, for instance along a plane defined by the longitudinal and lateral directions. Thus, the top and bottom surfaces 96 and 98 can extend along both the lateral direction A and the longitudinal direction L when mated to the electrical connector 56. The second printed circuit board 54 likewise defines a leading edge 91 with respect to a direction of insertion so as to mate with the electrical connector 56.

Figure 5:
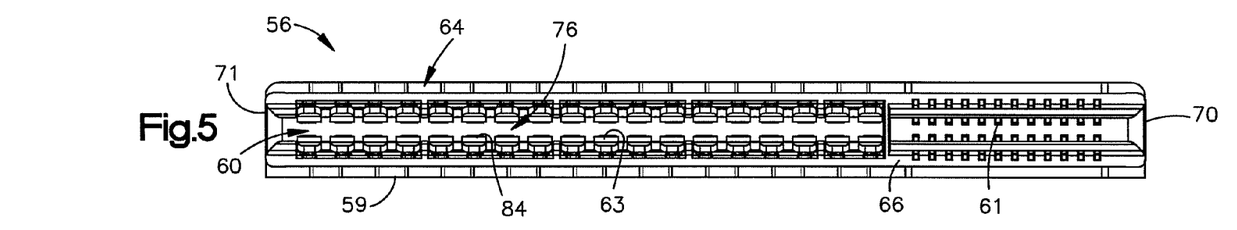
FIG. 5 is a front elevation view of the electrical connector illustrated in FIG. 2.

Referring to FIGS. 3-5, the connector housing 58 includes a chamber 76 that is defined by the housing body 59. The electrical contacts 60 are carried by the housing 58 such that the electrical contacts 60 are at least partially disposed in the chamber 76. The chamber 76 can be open to the mating interface 64, and can be configured to receive the second printed circuit board 54 so as to mate the electrical connector to the second printed circuit board 54. The chamber 76 can be open or partially closed to the mounting interface 62. For instance, the housing body 59 can include a rear wall 78 that partially closes the chamber 76 at the mounting interface 62. The housing body 59 can define a plurality of apertures 80 that extend through the rear wall 78, such that the electrical contacts 60 extend through respective ones of the apertures 80.

The electrical contacts 60 can be made of any suitable electrically conductive material as desired, such as a copper alloy. The electrical contacts 60 can include a plurality of electrical signal contacts 61 that are sized and configured to transmit electrical communications or data signals between the first and second printed circuit boards 52 and 54, and a plurality of electrical power contacts 63 that are sized and configured to transmit power, such as DC and/or AC power, between the first and second printed circuit boards 52 and 54. Thus, the electrical power contacts 63 can be sized larger than the electrical signal contacts 61 so as to support DC and/or AC power. For instance, the electrical power contacts 63 can have a thickness (e.g., in one or both of the lateral and longitudinal directions) that is greater than that of the electrical signal contacts 61. In accordance with the illustrated embodiment, the electrical contacts 60 can be arranged such that the electrical signal contacts 61 are disposed laterally adjacent the electrical power contacts 63. For instance, the electrical signal contacts 61 can be disposed adjacent one of the side walls of the housing body 59, such as the first side wall 70 as illustrated. Individual ones of the electrical signal contacts 61 can be spaced laterally such that the electrical signal contacts 61 are arranged laterally inward from the first side wall 70 toward the second side wall 71. The electrical power contacts 63 can be disposed adjacent the opposite one of the side walls with respect to the side wall that is adjacent the electrical signal contacts 61. In accordance with the illustrated embodiment, the electrical power contacts 63 are disposed adjacent the second side wall 71. Individual ones of the electrical power contacts 63 can be spaced laterally such that the electrical power contacts 63 are arranged laterally inward from the second side wall 71 toward the first side wall 70.

Alternatively, as illustrated in FIGS. 11A-D, the electrical connector 56 can be constructed such that the electrical contacts 60 are devoid of electrical signal contacts, and thus include only power contacts 63. The power contacts can be arranged between the first and second side walls 70 and 71. Thus, reference herein to the electrical contacts 60 can include both electrical signal contacts 61 and electrical power contacts as illustrated in FIGS. 1-9, or only electrical power contacts 63 as illustrated in FIGS. 11A-D.

Referring now to FIGS. 2A-4 and FIGS. 7-8, the connector housing 58 can include at least one lateral row of apertures such as first and second lateral rows of apertures 65 and 67 that extend transversely through the upper and lower ends 74 and 72 of the housing body 59. The first row of apertures 65 can be disposed proximate to the mating interface 64, and the second row of apertures 67 can be disposed proximate to the mounting interface 62. The first row of apertures 65 can be aligned with the electrical power contacts 63 so as to facilitate the dissipation of heat from the connector housing 58. Heat can be generated as electrical power is transmitted along the electrical power contacts 63 during operation of the electrical connector assembly 50. The electrical connector 58 can include tabs 69 that extend into respective ones of the second row of apertures 67 and are configured to latch onto the electrical power contacts 63 so as to assist in securing the electrical power contacts 63 in the connector housing 58.

Each of the electrical contacts 60, including the electrical signal contacts 61 and the electrical power contacts 63, can define respective mounting ends 82 and opposed mating ends 84 that are longitudinally spaced from the mounting ends 82. The mounting ends 82 are operatively associated with the mounting interface 62 such that the mounting ends 82 electrically and physically attach to electrical contact pads 86 of the first printed circuit board 52 at respective connection locations 83 when the electrical connector 56 is mounted to the first printed circuit board 52. The mating ends 84 are operatively associated with the mating interface 64 such that the mating ends 84 electrically connect to electrical contact pads 88 of the second printed circuit board 54 when the electrical connector 56 is mated to the second printed circuit board 54. Accordingly, when the electrical connector 56 is attached to the first and second circuit boards 52 and 54, respectively, an electrically conductive path may be established from and between the electrical contact pads 86 on the first printed circuit board 52, through respective electrical contacts 60, and respective electrically contact pads 88 of the second printed circuit board 54. The first and second circuit board 52 and 54 each also carry electrical traces that are electrically connected to the respective electrical contact pads 86 and 88.

The electrical contact pads 86 are disposed proximate to the leading edge 90 of the first printed circuit board 52, and the electrical contact pads 88 are disposed proximate to the leading edge 91 of the second printed circuit board 54. When the electrical connector 22 is mounted onto the first printed circuit board 52, the side walls 70 and 71 of the housing body 59 are illustrated as elongate in a direction substantially perpendicular with respect to the leading edge 90 of the first printed circuit board 52. Likewise, when the electrical connector 22 is mated to the second printed circuit board 54, the side walls 70 and 71 of the housing body 59 are illustrated as elongate in a direction substantially perpendicular with respect to the leading edge 91 of the second printed circuit board 54.

The mating ends 84 of the electrical contacts 60, including the electrical signal contacts 61 and the electrical power contacts 63, can be carried within the housing body 59, for instance in the chamber 76, and include respective transversely opposed prongs that are configured to straddle the leading edge of the second printed circuit board 54 when the second printed circuit board 54 is inserted into the chamber 76 at the mating interface 64 so as to mate the electrical connector 56 and the second printed circuit board 54. The mounting ends 82 of the electrical contacts 60, including the electrical signal contacts 61 and the electrical power contacts 63, can extend through the rear wall 78 of the housing body 59. As illustrated in FIG. 4, each respective mounting end 82 may include opposing prongs 94 that define the respective mounting ends 82, such that the first row of mounting ends 82 and the second row of mounting ends 82 define a gap 95 therebetween. The prongs 94 further present flared distal ends that can provide guidance when mounting the electrical connector 56 to the first printed circuit board 52. The gap 95 defines a thickness, illustrated as a first thickness T1, which can be a transverse distance between the mounting ends 82 that are configured to contact the electrical contact pads 86 of the respective top and bottom surfaces 96 and 98 of the first printed circuit board 52.

As illustrated in FIG. 2B, when the electrical connector 56 is attached to the first printed circuit board 52, the opposing prongs 94 straddle the first printed circuit board 52, for instance at the leading edge 90, which is inserted into the gap 95. The electrical contact pads 86 may be disposed on one or both of the top surface 96 and the bottom surface 98 of the first printed circuit board 52, and may be sized so as to electrically connect to individual ones of the electrical contacts 60, or can be sized to electrically connect to more than one of the electrical contacts 60. For instance, in accordance with the illustrated embodiment, one or more up to all of the electrical contact pads 86 can be sized to electrically connect to individual ones of the electrical signal contacts 61. Furthermore, in accordance with the illustrated embodiment, one or more up to all of the electrical contact pads 86 can be sized to electrically connect to more than one of the electrical power contacts 63, though it should be appreciated that one or more, up to all, of the electrical contact pads 86 can be sized so as to electrically connect to individual ones of the electrical power contacts 63. Thus, when the electrical connector 56 is attached to the first printed circuit board 52, the mounting ends 82 of the electrical contacts 60 may pinch the top surface 96 and bottom surface 98 of the first printed circuit board 52 and establish an electrically conductive path from the electrical contacts 60 to the electrical contact pads 86 and the respective electrical traces that are carried by the first printed circuit board 52.

The electrical connector 56 can be attached to the first printed circuit board 52 by imparting a relative longitudinal motion on at least one of the connector 56 and circuit board 52 along a longitudinal insertion direction such that the mounting interface 62 of the electrical connector 56 receives the leading edge of the first circuit board 52 until the electrical contacts 60 engage the electrical contact pads 86. The electrical contacts 60 can then be soldered to the electrical contact pads 86 as desired so as to permanently secure the first printed circuit board 52 to the electrical connector 56. In this regard, the first printed circuit board 52 can be referred to as a host board.

Figure 6:
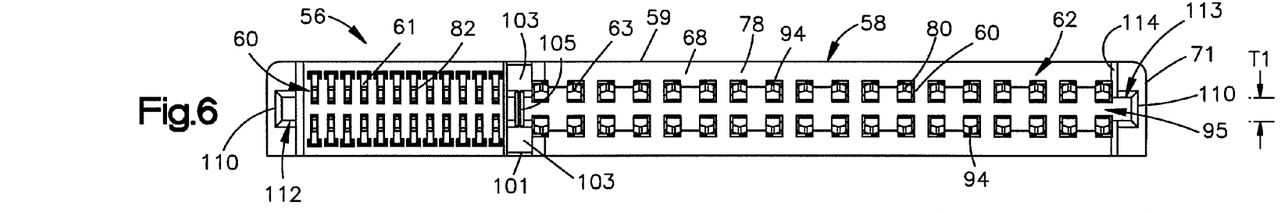
FIG. 6 is a rear elevation view of the electrical connector illustrated in FIG. 2.
Figure 7:
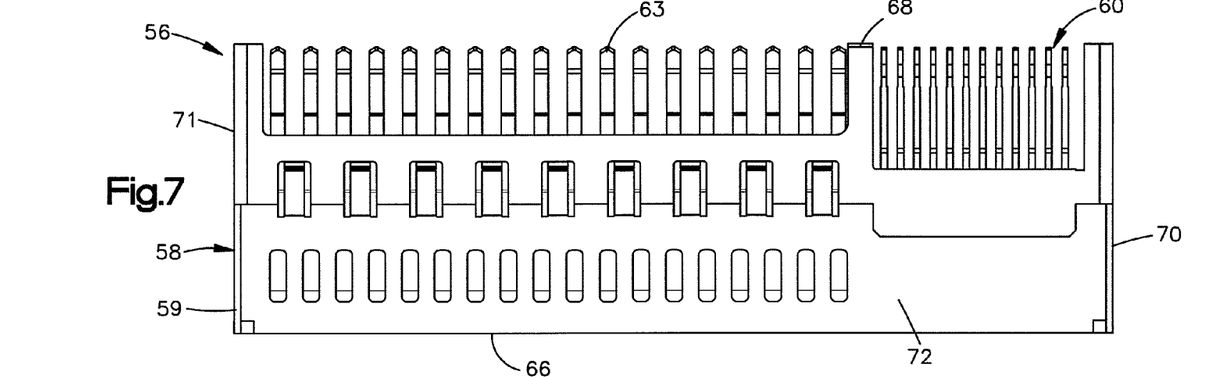
FIG. 7 is a top plan view of the electrical connector illustrated in FIG. 2.
Figure 8:
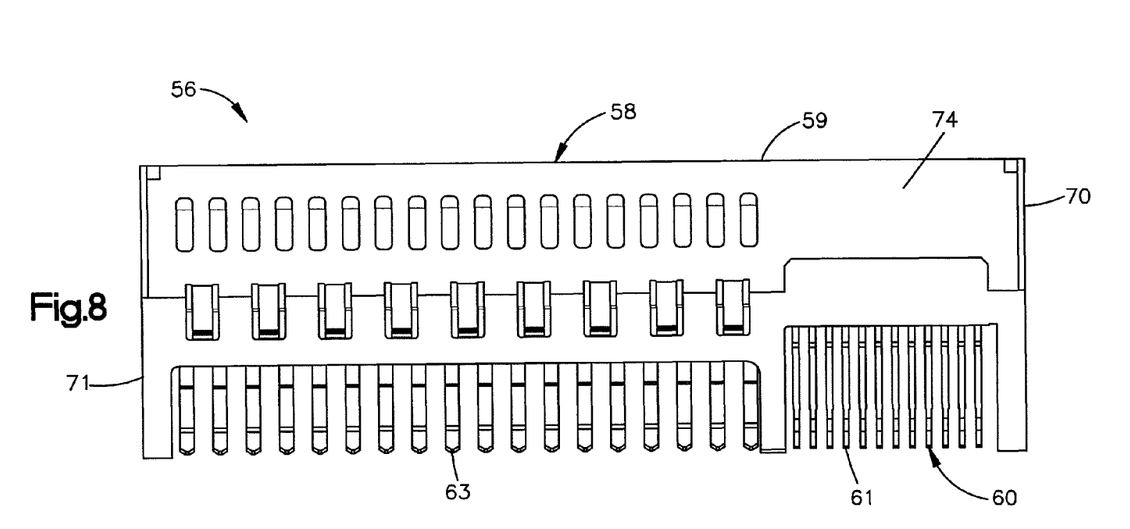
FIG. 8 is a bottom plan view of the electrical connector illustrated in FIG. 2.
Figure 9A:
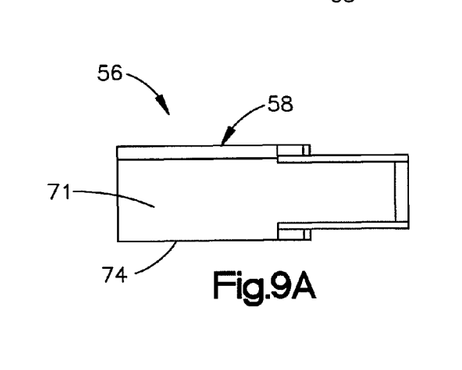
FIGS. 9A-B are side elevation views of the electrical connector illustrated in FIG. 2.
Figure 9B:
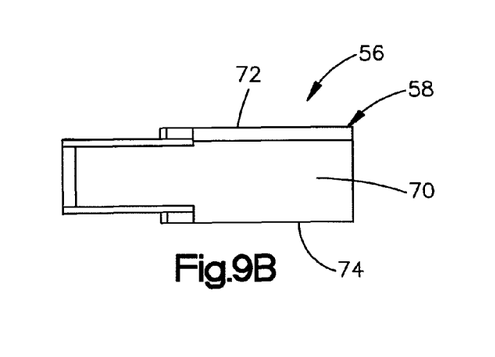
Figure 10A:
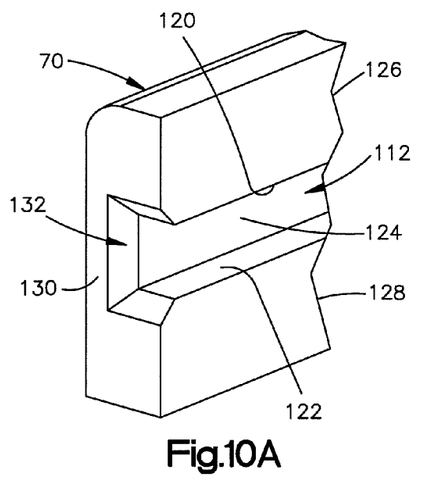
FIG. 10A is a perspective view of a first side wall of the electrical connector illustrated in FIG. 2A.
Figure 10B:
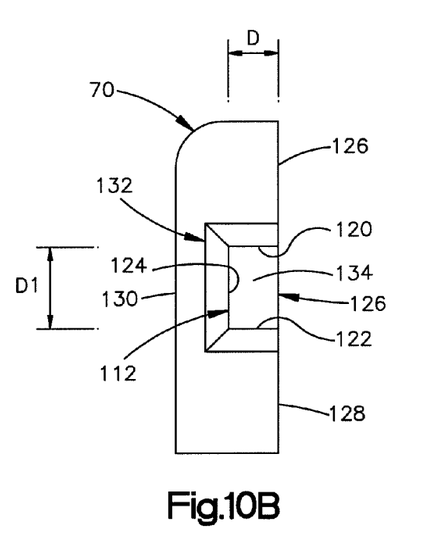
FIG. 10B is an end elevation view of the first side wall illustrated in FIG. 10A.
Figure 10C:
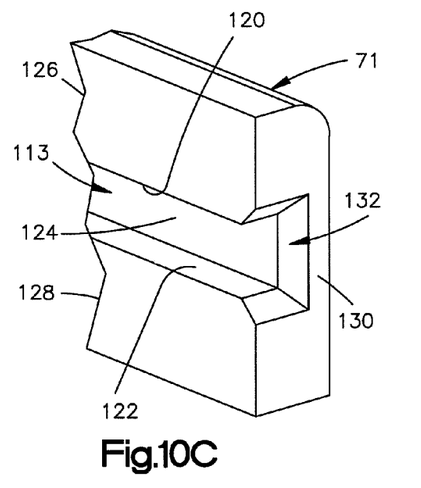
FIG. 10C is a perspective view of a second side wall of the electrical connector illustrated in FIG. 2A.
Figure 10D:
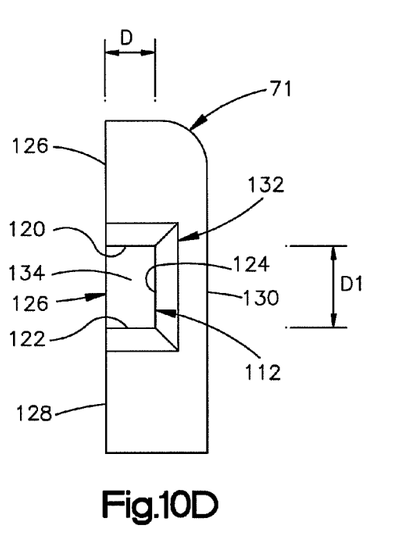
FIG. 10D is an end elevation view of the second side wall illustrated in FIG. 10C.
Figure 11A:
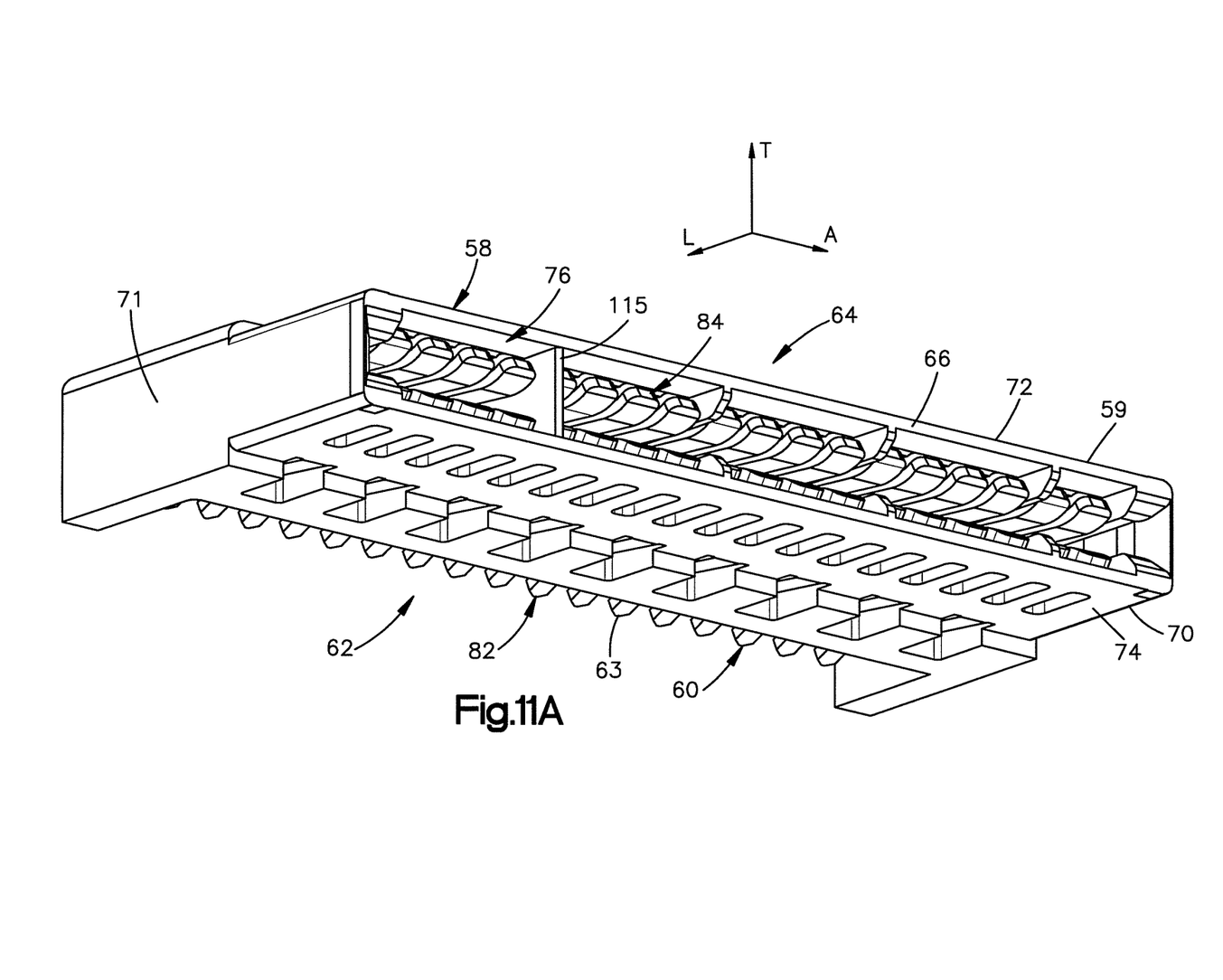
FIG. 11A is a bottom front perspective view of an electrical connector constructed similar to the electrical connector as illustrated in FIG. 4.
Figure 11B:
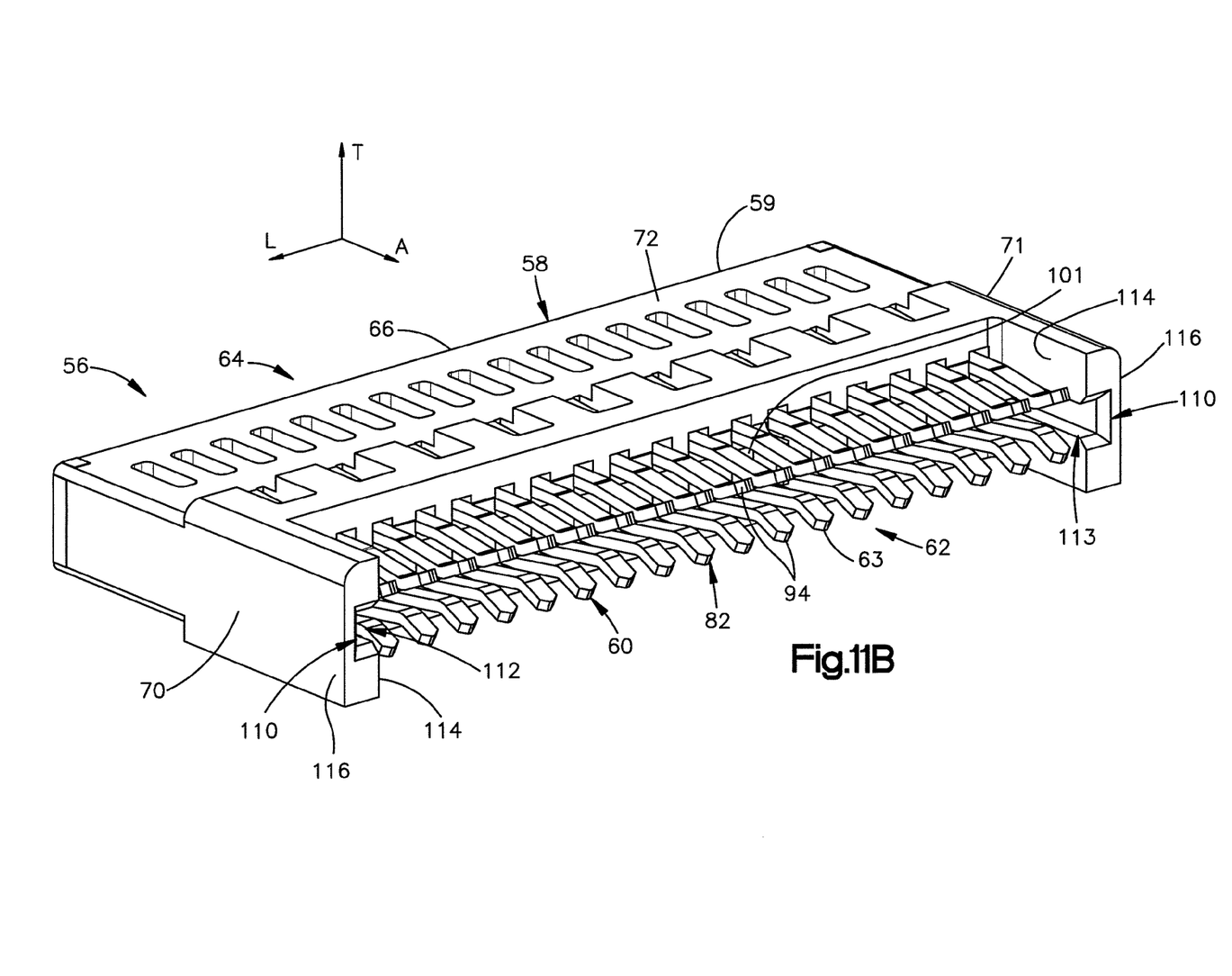
FIG. 11B is a top rear perspective view of the electrical connector illustrated in FIG. 11A.
Figure 11C:
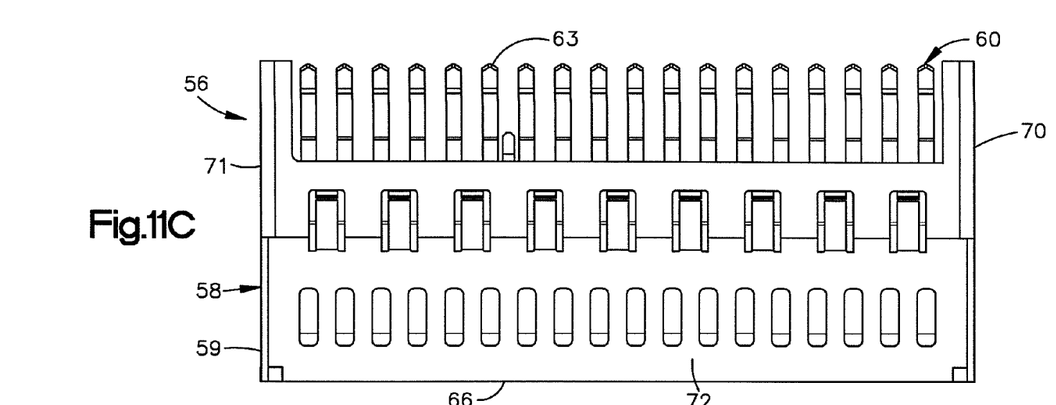
FIG. 11C is a top plan view of the electrical connector illustrated in FIG. 11.
Figure 11D:
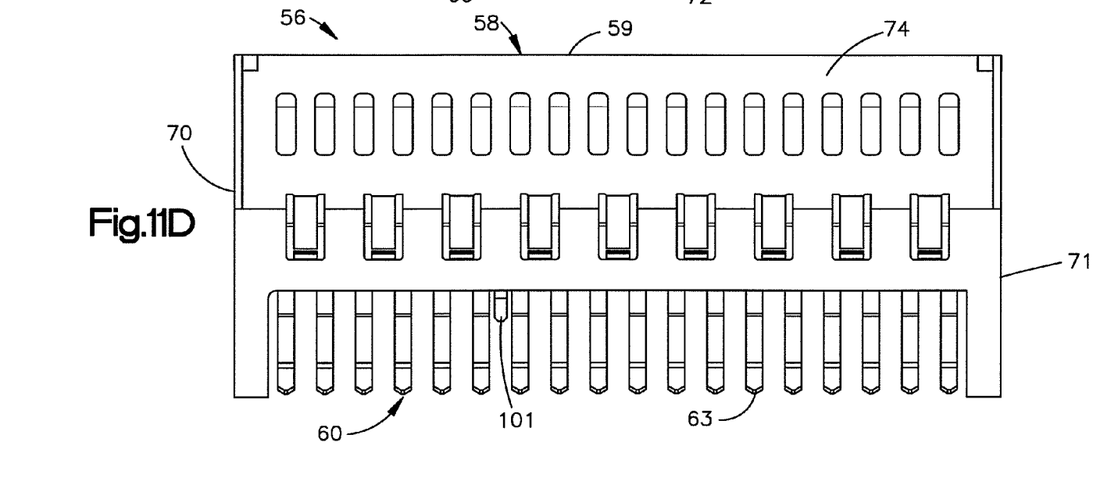
FIG. 11D is a bottom plan view of the electrical connector illustrated in FIG. 10.

As illustrated in FIGS. 4 and 6, the connector housing 58 can include a polarization member in the form of a polarization wall 101 that extends transversely between the upper end 72 and the lower end 74 at a location laterally between the signal contacts 61 and the power contacts 63 at the mounting end 62. The polarization wall 101 is thus disposed at a location laterally offset with respect to a laterally central location of the housing body 59. The first printed circuit board 52 can define a slot 109 (see FIG. 2B) that extends longitudinally in from the leading edge of the first circuit board, and is sized so as to receive the polarization wall 101, thereby ensuring that the first printed circuit board 52 is properly oriented for connection to the electrical connector 56. In particular, the electrical contact pads 86 that are configured to engage the signal contacts 61 in fact engage the signal contacts 61 when the electrical connector 56 is mounted to the first printed circuit board 52, and the electrical contact pads 86 that are configured to engage the power contacts 63 in fact engage the power contacts 63 when the electrical connector 56 is mounted to the first printed circuit board 52.

Furthermore, the polarization wall 101 can include opposed outer portions 103, illustrated as opposed upper and lower portions, and a middle portion 105 disposed between the opposed outer portions 103. The opposed outer portions 103 can have a lateral thickness greater than the middle portion 105. For instance, the lateral thickness of the opposed outer portions 103 can be greater than that of the slot 109 extending into the leading edge of the first circuit board 52, and the 90. The lateral thickness of the middle portion 105 can be sized substantially equal to or less than that of the slot 109 such that the middle portion 105 is configured to be received in the slot 109. The middle portion 105 can define a transverse dimension or height equal to that of the first printed circuit board 52 such that the first printed circuit board 52 can be substantially captured between the upper and lower portions 103 so as to facilitate engagement of the electrical contact pads 86 and the electrical contacts 60.

The middle portion 105 is aligned with the gap 95 between the prongs 94 of the mounting ends 82 of the electrical contacts 60. Accordingly, the middle portion 105 of the polarization wall 101 provides an alignment guide that causes the first printed circuit board 52 to be properly aligned with the electrical contacts 60 when the electrical connector 56 is mounted to the first printed circuit board 52. In this regard, it should be appreciated that the first printed circuit board 52 includes a complementary polarization member and alignment guide that are each configured to engage the polarization member and alignment guide of the electrical connector 56. In accordance with the illustrated embodiment, the polarization member and alignment guide of the first printed circuit board 52 are provided by the slot 109 that extends longitudinally into the leading edge of the first circuit board 52. However, the polarization member and the alignment guide of both the electrical connector 56 and the first printed circuit board 52 can alternatively be provided as two separate members that are spaced apart from each other if desired. Alternatively still, as illustrated in FIGS. 11A-D, the electrical connector 56 can be devoid of the polarization wall 101, for instance when the electrical contacts 60 are devoid of electrical signal contacts, and only include electrical power contacts 63.

Referring again to FIGS. 2B and 3, before or after the electrical connector 56 has been mounted to the first printed circuit board 52, an edge card, such as the second printed circuit board 54, can be removably mated with the electrical connector 56. In particular, the electrical connector 56 can be attached to the second printed circuit board 54 by imparting a relative longitudinal motion on at least one of the electrical connector 56 and second circuit board 54 such that the mating interface 64 of the electrical connector 56 receives the leading edge 91 of the second printed circuit board 54 along a longitudinal insertion direction until the electrical contacts 60 engage the electrical contact pads 88.

The connector housing 58 can include a second polarization member in the form of a polarization wall 115 that extends between the upper end 72 and the lower end 74 at a location laterally between the signal contacts 61 and the power contacts 63 at the mating end 64. The polarization wall 115 is thus disposed at a location offset with respect to a laterally central location of the housing body 59. The second printed circuit board 54 can define a slot 111 that extends in from the leading edge 91 and is sized so as to receive the polarization wall 115, thereby ensuring that the second printed circuit board 54 is properly oriented for connection to the electrical connector 56. In particular, when the electrical connector 56 is mated with the second printed circuit board 54, select ones of the electrical contact pads 88 can engage the signal contacts 61, and select ones of the electrical contact pads 88 can engage the power contacts 63.

It is recognized that when mating the second printed circuit board 54 to the electrical connector 56, angular or directional misalignments between the leading edge 91 of the second printed circuit board 54 and the chamber 76 of the housing body 59 can apply stress to the electrical contacts 60, which in turn applies stress to the solder connection between the electrical contacts 60 and the electrical contact pads 86 of the first printed circuit board 52. For instance, when the second printed circuit board 54 is misaligned with the connector housing 58 as the second printed circuit board 54 is inserted into the chamber 76, insertion forces can be translated to the electrical contacts 60 and thus to the solder connection that attaches the electrical contacts 60 to the electrical contact pads 86 of the first printed circuit board 52.

Accordingly, as described above, conventional straddle mount connectors include a pair of mounting ears 44 that secure the first printed circuit board 24 to the connector housing 58 (see FIG. 1) so as to prevent the misaligned mating forces from biasing the electrical connector 22 into movement with respect to the first printed circuit board 24, which could create misalignment stresses to the connection between the electrical contacts 60 and the first printed circuit board and could affect the integrity of the solder connection between the electrical contacts 32 and the contact pads 86 of the first printed circuit board 52. However, the mounting ears 44 occupy valuable real estate on the first printed circuit board 24.

Furthermore, referring now to FIGS. 2A-4 and FIG. 6, it is recognized that the connector housing 58 can be devoid of mounting ears of the type described above with respect to FIG. 1, and is also configured to limit the stresses experienced by the electrical contacts 60, for instance when the second printed circuit board 54 is misaligned with the housing body 59 as the electrical connector 56 is mated to the second printed circuit board 54. It should thus be appreciated that the first printed circuit board 52 can be devoid of apertures that are configured to receive a fastener so as to secure the first printed circuit board 52 to the electrical connector 56. In accordance with one embodiment, because the electrical signal contacts 61 are thinner than the power contacts 63, the mating stresses of conventional straddle-mount connectors are more likely to affect the integrity of the solder connection between the electrical signal contacts 61 and the electrical contact pads 86 of the first printed circuit board 52 as compared to the solder connection between the electrical power contacts 63 and the electrical contact pads 86 of the first printed circuit board 52. The electrical connector 56 can be devoid of mounting ears and at the same time can limit misalignment stresses to within an acceptable level, that is a level that does not cause the solder connection between the electrical contacts 60 and the electrical contact pads 86 of the first printed circuit board 52 to fail.

In accordance with the illustrated embodiment, the connector housing 58 of the electrical connector 56 is devoid of mounting ears, and instead includes at least one mounting guide, such as a pair of mounting guides 110 that each slidably engages the first printed circuit board 52 when the electrical connector 56 is mounted to the first printed circuit board 52. The mounting guides 110 can be carried by a respective at least one side wall of the connector body 59, such as the first and second the side walls 70 and 71. The first and second mounting guides 110 can be defined by respective first and second laterally opposed channels 112 and 113 that are carried by the corresponding side walls 70 and 71. For instance, the first and second side walls 70 and 71 define respective laterally inner surfaces 114 that face each other, and opposed laterally outer surfaces 116 that face away from the respective inner surfaces 114. In accordance with one embodiment, one or both of the first and second channels 112 and 113 can be defined by the respective side walls 70 and 71 and extend laterally outward into the inner surfaces 114 and 116.

Thus, referring now to FIGS. 2A-B and 10A-D, each of the side walls 70 and 71 can define a first or upper interior surface 120 and a transversely opposed second or lower interior surface 122 that is transversely spaced from the upper interior surface 120. The upper and lower interior surfaces 120 and 122 can define the transverse upper and lower boundaries of the respective first and second channels 112 and 113. Each of the side walls 70 and 71 can further define a third or lateral surface 124 that is connected between the upper and lower surfaces 120 and 122. The lateral surface 124 can define a first lateral end, such as a laterally outer end, of the respective first and second channels 112 and 113. The first and second channels 112 and 113 can further include a second opposed laterally inner end 126, or mouth, that is open and configured to receive the first printed circuit board 52. The upper and lower surfaces 120 and 122 can be substantially parallel to each other as illustrated, or can be angularly offset with respect to each other. Furthermore, the lateral surface 124 can be perpendicular to the upper and lower surfaces 120 and 122, or can define any angle with respect to the upper and lower interior surfaces 120 and 122 as desired. The upper interior surface 120 is spaced from the upper end 72 of the housing body 59, and the lower interior surface 122 is spaced from the lower end 72 of the housing body 59, for instance a distance that is substantially equal to the distance that the upper interior surface 120 is spaced from the upper end 72 of the housing body 59. Thus, each of the channels 112 and 113 can be substantially symmetrically spaced with respect to the upper and lower ends 72 and 74 of the housing body 59.

Each of the first and second side walls 70 and 71 can thus include a first transverse outer, or upper, portion 126, that presents a respective transverse inner surface that provides the upper interior surface 120, a second transverse outer, or lower, portion 128, that presents a respective transverse inner surface that provides the upper interior surface 122, and a third lateral portion 130 that defines the lateral surface 124. The first transverse outer portion 126, the second transverse outer portion 128, and the third lateral portion 130 can be integral with each other, such that the channels 112 and 113 are recessed into the respective first and second side walls 70 and 71, or can be separate from and attached to each other so as to define the channels 112 and 113. The channels 112 and 113 can be laterally aligned with each other, and further aligned with the gap 95 between the prongs 94 of the electrical contacts. Accordingly, a straight line, such as a laterally extending line, that extends through the gap 95 can further extend into the channels 112 and 113. Furthermore, a straight line, such as a laterally extending line, that extends into the channels 112 and 113 can intersect at least one up to all of the electrical contacts 60, for instance the prongs 94, of one or both of the first and second rows of electrical contacts. For instance, in accordance with one embodiment, each of the upper and lower rows of electrical contacts 60 extend along a transverse direction so as to cross a plane that is defined by the respective upper and lower surfaces 120 and 122 that at least define the channels 112 and 113. Otherwise stated, a straight line that extends from the upper interior surface 120 of one of the channels 112 and 113 to the upper interior surface 120 of the other of the channels 112 and 113 can intersect at least one, up to all, of the electrical contacts 60 of the first row of electrical contacts 60. Likewise, a straight line that extends from the lower interior surface 122 of one of the channels 112 and 113 to the lower interior surface 122 of the other of the channels 112 and 113 can intersect at least some, up to all, of the electrical contacts 60 of the second row of electrical contacts 60. Furthermore, the first and second channels 112 and 113 can be aligned with the middle portion 105, or the alignment guide, of the electrical connector 56, such that the first printed circuit board 52 can be inserted into the channels 112 and 113, which further causes the leading edge 90 of the first printed circuit board 52 to be inserted the gap 95 of the electrical contacts 60.

The channels 112 and 113 can each further include a longitudinally outer end 132 that provides a leading end with respect to the direction of insertion 87 when mounting the electrical connector 56 to the first printed circuit board 52. The channels 112 and 113 can further each include a longitudinally inner end 134 that is longitudinally opposite the outer end 132 and provides a trailing end with respect to the direction of insertion 87. The outer ends 132 can be open, and is configured to receive the first printed circuit board 52, for instance at the leading edge 90, when the channels 112 and 113 receive the first printed circuit board 52 as the electrical connector 56 is mounted to the first printed circuit board 52, such that the channels 112 and 113 capture the opposed sides 51 and 53 of the first printed circuit board 52. The outer ends 132 can be beveled so as to narrow as the leading edge 90 is inserted into the channels 112 and 113. The inner ends 134 can define a stop surface that is configured to abut the leading edge 90 so as to limit the insertion depth of the first printed circuit board 52 in the electrical connector 56. Thus, each of the channels 112 and 113 can each define first or longitudinal insertion depth that is parallel to the insertion direction 87 between the longitudinally outer end 132 and the longitudinally inner end 134. The rear end 68 of the housing body 59 can also abut the leading edge 90 of the first printed circuit board so as to provide a stop that limits the insertion depth of the first printed circuit board into the electrical connector 56. Furthermore, each of the channels 112 and 113 define a second or lateral insertion depth D as measured laterally from the respective laterally inner end 126 to the respective lateral surface 124. Each of the channels 112 and 113 further defines a third or transverse depth D1 as measured transversely between the upper interior surface 120 and the lower interior surface 122. The transverse depth D1 can be greater than the first thickness T1 of the gap 95. Furthermore, the mounting ends 82 of the first and second rows of electrical contacts 60 that define the transverse thickness T1 can be inwardly offset with respect to upper and lower interior surfaces 120 and 122.

During operation, when the electrical connector 56 is mounted to the first printed circuit board 52, at least a first channel, such as the first and second channels 112 and 113 receive a respective at least one side of the printed circuit board 52, such as the first and second sides 51 and, such that the first printed circuit board 52, for instance at the sides 51 and 53, extends longitudinally into the channels 112 and 113 an amount substantially equal to the longitudinal insertion depth when the first printed circuit board 52 is fully received in the channels 112 and 113, for instance until the leading edge 90 abuts the inner ends 134 and/or the rear end 68 of the housing body 59. Furthermore, the at least one channel, such as the channels 112 and 113, receive the at least one side, such as the first and second sides 51 and 53, of the first printed circuit board 52, such that the first printed circuit board 52, for instance at the sides 51 and 53, extends laterally into the channels 112 and 113 an amount substantially equal to the lateral insertion depth D. As the electrical connector 56 is mounted to the first printed circuit board, the prongs 94 of the electrical contacts 60, for instance at the respective mounting ends 82, straddle the first printed circuit board 52, such that each of the first row of the electrical contacts 60 contacts the electrical contact pads 86 of the upper surface 96 of the first printed circuit board, and each of the second row of the electrical contacts 60 contacts the electrical pads 86 of the lower surface 98 of the first printed circuit board 52. The first thickness T1 of the gap 95 can be less than or substantially equal to (but not greater than) the second thickness T2 of the first printed circuit board 52 prior to inserting the first printed circuit board 52 into the gap 95. Accordingly, the first printed circuit board 52 can cause the mounting ends 82 to deflect away from each other as the leading edge 90 is received in the gap 95.

It should thus be appreciated that the housing body 59 defines a first lateral dimension, or width W1, as defined between the lateral surfaces 124 of the first and second side walls 70 and 71, and the first printed circuit board 52 defines a lateral dimension, or width W2, between the sides 51 and 53, such that the first width W1 can be substantially equal to (e.g., equal to or slightly greater than) the second width W2. Furthermore, the first printed circuit board 52 defines a thickness, illustrated as a second thickness T2, which can be a transverse thickness between the upper and lower surfaces 96 and 98 such that the third transverse depth D3 is substantially equal to (e.g., equal to or slightly greater than) the second thickness T2. Accordingly, the first and second side walls 70 and 71 are configured to capture the sides 51 and 53 of the first printed circuit board 52 in the channels 112 and 113, such that at least a portion of misalignment forces that can be generated when mating the electrical connector 56 to the second circuit board 54 are communicated from the connector housing 58, such as the respective first and second side walls 70 and 71, to the received side of the printed circuit board as the first and second side walls 70 and 71 are in mechanical communication (for instance in direct contact) with the respective sides 51 and 53 of the first printed circuit board 52. For example, at least a portion of transverse misalignment forces can be communicated from the first transverse outer, or upper, surface 120 to the upper surface 96 of the first printed circuit board 52, and/or from the second transverse outer, or lower, portion 122 to the lower surface 98 of the first printed circuit board 52 at a location spaced from the electrical contact pads 86. At least a portion of lateral misalignment forces can be communicated from at least one or both of the third lateral surfaces 124 to the respective sides 51 or 53 of the first printed circuit board 52. It should be appreciated that the misalignment forces that are communicated from the respective side walls 70 and 71 to the first printed circuit board 52 bypass the electrical contacts 60 and the connection between the electrical contacts 60 and the electrical contact pads 86.

The lateral surface 124 and the inner ends 134 and/or the rear end 68 of the housing body 59 can be positioned such that the electrical contact pads 86 become physically and electrically connected to the electrical contacts 60 when the first printed circuit board 52 is fully received in the channels 112 and 113. Furthermore, because the first width W1 of the housing body 59 is substantially equal to the width W2 of the first printed circuit board 52, and because the transverse depth D1 of the channels 112 and 113 is substantially equal to the second thickness T2 of the first printed circuit board 52, the first printed circuit board 52 is captured in the at least one channel, such as the channels 112 and 113 such that at least a portion of the forces applied to the connector 56 due to misalignment between the second printed circuit board 54 and the electrical connector 56 when mating electrical connector 56 to the second printed circuit board 54 are, in turn, applied to the received first printed circuit board 52, thereby isolating the portion of the forces from the connection between the electrical contacts 60 and the first printed circuit board 52. The electrical connector 56 can be mounted to the first printed circuit board 52 without the use of mechanical fasteners that extend through the first printed circuit board 52. Thus, it can be said that the electrical connector assembly 50 can be devoid of mechanical fasteners that extend through the first printed circuit board 52 so as to mount the electrical connector 56 to the first printed circuit board 52.

A method to mount, or to teach mounting of, a card-edge connector to a printed circuit board can include the steps of A) providing or teaching the use of a first printed circuit board having a leading edge, opposed sides, and electrical contact pads, B) providing an electrical connector having a connector housing that includes 1) a housing body, the housing body defining first and second side walls and 2) carries a plurality of electrical contacts that are arranged between the first and second side walls, the electrical contacts respective mounting ends having opposed prongs that are configured to straddle the first printed circuit board and electrically and physically attach to the first printed circuit board at respective ones of the electrical contact pads, and an opposed mating end configured to be electrically connected to a second printed circuit board when the electrical connector is mated to the second printed circuit board, and C) teaching the step of inserting the first printed circuit board into the first and second channels and connecting each of the plurality of electrical contacts to respective ones of the electrical contact pads at connection locations, such that at least a portion of forces that are generated when the second printed circuit board is misaligned with the electrical connector as the electrical connector is mated with the second printed circuit board is communicated from the connector housing to the inserted printed circuit board at a location spaced from the connection locations.

The embodiments described in connection with the illustrated embodiments have been presented by way of illustration, and the present invention is therefore not intended to be limited to the disclosed embodiments. Furthermore, the structure and features of each of the embodiments described above can be applied to the other embodiments described herein, unless otherwise indicated. Accordingly, those skilled in the art will realize that the invention is intended to encompass all modifications and alternative arrangements included within the spirit and scope of the invention, for instance as set forth by the appended claims

What is claimed:

1. A card-edge connector configured to be mounted to a first printed circuit board along a direction of insertion, the card-edge connector comprising:
    a connector housing including a housing body that defines first and second side walls and carries a plurality of electrical contacts that are arranged between the first and second side walls, the electrical contacts defining respective mounting ends configured to contact the first printed circuit board at respective connection locations, and opposed respective mating ends configured to be electrically connected to a second printed circuit board when the electrical connector is mated to the second printed circuit board, wherein the electrical contacts are arranged in first and second rows and define a gap between the mounting ends of the first and second rows, and the gap is less than a thickness of the first printed circuit board such that the electrical contacts straddle the first printed circuit board when the electrical connector is mounted to the first printed circuit board; and
    at least one mounting guide carried by a respective at least one of the first and second side walls, the at least one mounting guide configured to slidably receive a side of the first printed circuit board as the card-edge connector is mounted to the first printed circuit board along the direction of insertion,
    wherein at least a portion of forces that are generated when the second printed circuit board is misaligned with the electrical connector as the electrical connector is mated with the second printed circuit board is communicated from the connector housing to the received side of the first printed circuit board at a location spaced from the connection locations.

2. The card-edge connector as recited in claim 1, wherein the at least one mounting guide comprises a channel that receives the first printed circuit board as the card-edge connector is mounted to the first printed circuit board.

3. The card-edge connector as recited in claim 2, wherein the mounting ends of the first and second rows of electrical contacts are inwardly spaced with respect to upper and lower interior surfaces that define the channel.

4. The card edge connector as recited in claim 1, wherein the first printed circuit board defines opposed upper and lower surfaces that define a thickness therebetween, and the at least one channel defines a depth substantially equal to the thickness.

5. The card-edge connector as recited in claim 1, wherein the at least one mounting guide is a first mounting guide carried by the first side wall and configured to receive a first side of the first printed circuit board when the card-edge connector is mounted to the first printed circuit board, the card-edge connector further comprising a second mounting guide carried by the second side wall, the at least one mounting guide configured to receive a second side of the first printed circuit board when the card-edge connector is mounted to the first printed circuit board.

6. The card-edge connector as recited in claim 5, wherein the first and second mounting guides comprise respective first and second channels that receive opposed first and second sides, respectively, of the first printed circuit board as the card-edge connector is mounted to the first printed circuit board.

7. The card-edge connector as recited in claim 6, wherein the housing body defines a first width between the first and second channels, the first printed circuit board defines a second width between the first and second sides, and the first width is substantially equal to the second width.

8. The card-edge connector as recited in claim 6, wherein a straight line extending between the channels further intersects at least one of the electrical contacts.

9. The card edge connector as recited in claim 6, wherein each of the channels is substantially symmetrical with respect to upper and lower ends of the connector housing.

10. The card-edge connector as recited in claim 1, wherein the plurality of electrical contacts is disposed between the first and second side walls.

11. The card-edge connector as recited in claim 1, wherein the plurality of electrical contacts comprises a plurality of electrical signal contacts and a plurality of electrical power contacts.

12. The card-edge connector as recited in claim 11, wherein the electrical signal contacts each have a thickness less than that of the electrical power contacts.

13. The card-edge connector as recited in claim 1, wherein the plurality of electrical contacts comprises a plurality electrical power contacts and is devoid of electrical signal contacts.

14. A card-edge connector configured to mount to a first printed circuit board along a direction of insertion, the card-edge connector comprising:
    a connector housing including a housing body that defines first and second side walls and carries a plurality of electrical contacts that are arranged between the first and second side walls along a lateral direction, the electrical contacts defining respective mounting ends having opposed prongs that are configured to straddle the first printed circuit board and electrically and physically attach to the first printed circuit board at respective connection locations, and an opposed mating end configured to be electrically connected to a second printed circuit board when the electrical connector is mated to the second printed circuit board,
    wherein the first and second side walls each define respective first and second channels that have an open end that receives a leading edge of the first printed circuit board so as to attach to the first printed circuit board such that the first and second side walls capture opposed sides of the first printed circuit board in the respective first and second channels, and an entirety of each of the first and second channels is disposed outward with respect to all of the plurality of electrical contacts along the lateral direction.

15. The card edge connector as recited in claim 14, wherein the first printed circuit board defines opposed upper and lower surfaces that define a thickness therebetween, and the at least one channel defines a depth substantially equal to the thickness.

16. The card-edge connector as recited in claim 14, wherein the plurality of electrical contacts comprises a plurality of electrical signal contacts and a plurality of electrical power contacts.

17. The card-edge connector as recited in claim 14, wherein the plurality of electrical contacts comprises a plurality electrical power contacts and is devoid of electrical signal contacts.

18. A card-edge connector configured to mount to a first printed circuit board along a direction of insertion, the card-edge connector comprising:

a connector housing including a housing body that defines first and second side walls and carries a plurality of electrical contacts that are arranged along a lateral direction between the first and second side walls, the electrical contacts defining respective mounting ends having opposed prongs that are configured to straddle the first printed circuit board and electrically and physically attach to the first printed circuit board at respective connection locations, and an opposed mating end configured to be electrically connected to a second printed circuit board when the electrical connector is mated to the second printed circuit board, wherein 1) the first and second side walls define respective first and second channels that receive a leading edge of the first printed circuit board so as to attach to the first printed circuit board such that the first and side walls capture opposed sides of the first printed circuit board in the respective first and second channels, 2) each of the first and second side walls includes an upper surface and an opposed lower surface that define respective upper and lower ends of the channel, a lateral surface that defines a laterally outer end of the channel, and a laterally inner end that is inwardly spaced from the lateral surface along the lateral direction, and 3) the laterally inner end is open and configured to receive the leading edge of the first printed circuit board, such that the open laterally inner end of the first channel faces the open laterally inner end of the second channel.

* * * * *